(12) United States Patent
Iozsef et al.

(10) Patent No.: US 12,255,436 B2
(45) Date of Patent: Mar. 18, 2025

(54) PAM DRIVER WITH DISTRIBUTED MODULATION CURRENT SETPOINT FEEDBACK

(71) Applicant: MACOM Technology Solutions Holdings, Inc., Lowell, MA (US)

(72) Inventors: Eric Iozsef, Toronto (CA); Dario Soltesz, Rancho Santa Margarita, CA (US)

(73) Assignee: MACOM Technology Solutions Holdings, Inc., Lowell, MA (US)

( * ) Notice: Subject to any disclaimer, the term of this patent is extended or adjusted under 35 U.S.C. 154(b) by 120 days.

(21) Appl. No.: 17/124,252

(22) Filed: Dec. 16, 2020

(65) Prior Publication Data

US 2022/0190554 A1    Jun. 16, 2022

(51) Int. Cl.
| | |
|---|---|
| H01S 5/042 | (2006.01) |
| G05F 1/56 | (2006.01) |
| H01S 5/183 | (2006.01) |
| H03F 3/45 | (2006.01) |
| H03K 5/02 | (2006.01) |

(52) U.S. Cl.
CPC .............. *H01S 5/0427* (2013.01); *G05F 1/56* (2013.01); *H01S 5/0428* (2013.01); *H03F 3/45475* (2013.01); *H03K 5/02* (2013.01); *H01S 5/183* (2013.01)

(58) Field of Classification Search
CPC ...... H01S 5/0427; H01S 5/0428; H01S 5/183; G05F 1/56; H03F 3/45475; H03K 5/02
See application file for complete search history.

(56) References Cited

U.S. PATENT DOCUMENTS

| | | | |
|---|---|---|---|
| 3,746,889 A * | 7/1973 | Cubbison, Jr. ......... | H03H 11/08 327/39 |
| 6,772,351 B1 | 8/2004 | Werner et al. | |
| 9,059,557 B2 * | 6/2015 | Raj ...................... | H01S 3/1305 |
| 9,684,321 B2 * | 6/2017 | Leibowitz ............... | G05F 1/462 |
| 9,899,921 B1 * | 2/2018 | Paduvalli .............. | H02M 3/157 |
| 10,728,060 B2 * | 7/2020 | Peng ................. | H04L 25/03038 |
| 2007/0262934 A1 * | 11/2007 | Fujikawa ........... | H04N 1/40031 345/82 |
| 2007/0273437 A1 * | 11/2007 | Kaiho ................... | H03F 3/2173 330/10 |

(Continued)

FOREIGN PATENT DOCUMENTS

| | | | |
|---|---|---|---|
| CN | 101692521 A | * | 4/2010 |
| CN | 104090482 A | * | 10/2014 |

(Continued)

*Primary Examiner* — Lincoln D Donovan
*Assistant Examiner* — James G Yeaman

(57) ABSTRACT

A driver electronic circuit for a pulse amplitude modulation transmitter includes a plurality of transmission lanes. Each transmission lane is configured to independently generate a current output corresponding to data input into each transmission lanes. The driver electronic circuit also includes a summing node configured to sum the output currents from the plurality of transmission lanes. The driver electronic circuit further includes one feedback loop circuit coupled to the plurality of transmission lanes configured to control the currents of each said current outputs. The driver electronic circuit may be configured to drive a vertical-cavity surface-emitting laser for optical communication.

20 Claims, 3 Drawing Sheets

(56) References Cited

U.S. PATENT DOCUMENTS

| | | | |
|---|---|---|---|
| 2008/0002988 A1* | 1/2008 | Cheng | H04B 10/504 |
| | | | 398/182 |
| 2014/0126595 A1* | 5/2014 | Nedovic | H01S 5/0427 |
| | | | 372/38.02 |
| 2014/0210545 A1 | 7/2014 | Leibowitz et al. | |
| 2016/0156417 A1 | 6/2016 | Tanaka | |
| 2017/0063466 A1* | 3/2017 | Wang | H04B 10/564 |
| 2018/0358957 A1* | 12/2018 | Mort | H03K 5/14 |
| 2019/0020514 A1* | 1/2019 | Zhang | H04L 25/00 |
| 2019/0215146 A1* | 7/2019 | Ke | H04L 7/042 |
| 2020/0106649 A1 | 4/2020 | Peng et al. | |
| 2020/0110124 A1* | 4/2020 | Schweitzer, III | G01R 31/085 |

FOREIGN PATENT DOCUMENTS

| | | | | |
|---|---|---|---|---|
| CN | 106017533 A | * | 10/2016 | G01D 18/00 |
| CN | 106533197 A | * | 3/2017 | |
| CN | 106817119 A | * | 6/2017 | H03K 19/017527 |
| CN | 109038207 A | * | 12/2018 | H01S 5/022 |
| CN | 211743674 | * | 10/2020 | |
| CN | 211743674 U | * | 10/2020 | |
| EP | 2977849 A1 | * | 1/2016 | G05F 3/08 |
| KR | 20110100726 A | * | 9/2011 | |
| TW | 401720 B | * | 8/2000 | |
| TW | 201023691 A | * | 6/2010 | H01L 23/49838 |
| WO | WO-2013132691 A1 | * | 9/2013 | H01S 5/0428 |

\* cited by examiner

300

Start

↓

310 MEASURE A FIRST VOLTAGE ACROSS A VCSEL BASED ON A FIRST CALIBRATION CURRENT COUPLED THROUGH THE VCSEL

↓

320 MEASURE A SECOND VOLTAGE ACROSS A VCSEL BASED ON A SECOND CALIBRATION CURRENT COUPLED THROUGH THE VCSEL

↓

330 DETERMINE A RESISTANCE VALUE OF THE VCSEL BASED ON THE VOLTAGE MEASUREMENTS AND THE KNOWN CURRENTS

↓

340 SET BIAS AND MODULATION CURRENTS FOR A PAM DRIVER

↓

350 DRIVE COMMUNICATION DATA INTO THE VCSEL USING THE BIAS CURRENT AND MODULATION CURRENTS, AND UTILIZING A FEEDBACK CIRCUIT TO MAINTAIN THE CURRENTS

↓

End

Fig. 3

PAM DRIVER WITH DISTRIBUTED MODULATION CURRENT SETPOINT FEEDBACK

FIELD OF INVENTION

Embodiments of the present invention relate to the field of communications signal processing. More specifically, embodiments of the present invention relate to systems and methods for pulse amplitude modulation drivers with distributed modulation current setpoint feedback.

BACKGROUND

A typical communications link may include a Pulse Amplitude Modulation (PAM) transmitter and receiver in conjunction with a receiver. "PAM-4," a pulse amplitude modulation of three signals into four levels, is a common format for optical communications. In one example, the data rate can be 53.125 GBaud, which supports about 100 Gbps for PAM-4 modulation. Fiber-based optical communication typically utilizes a vertical-cavity surface-emitting laser, known as or referred to as a "VCSEL," a type of laser diode, as an emitter.

Unfortunately, vertical-cavity surface-emitting lasers are inherently non-linear in their electrical to optical characteristics. This leads to problems when trying to generate optical signals with a desirable low Transmission Dispersion and Eye Closure Quaternary (TDECQ) factor in pulse amplitude modulation applications. In particular, VCSELs have high slew rates on the optical rising edge, while at the same time having slow slew rates on the falling edge. Compounding the problem is that the slew rate is not the same at every optical power level. Without some sort of compensation, the optical signals will be skewed in time and amplitude making recovery of the optical signals on the receive side difficult or impossible.

SUMMARY OF THE INVENTION

Therefore, what is needed are systems and methods for pulse amplitude modulation (PAM) drivers with distributed modulation current setpoint feedback. What is additionally needed are systems and methods for PAM drivers with distributed modulation current setpoint feedback in which a single linear feedback control circuit controls bias and modulation currents of multiple transmission lanes. Further, there is a need for systems and methods for PAM drivers with distributed modulation current setpoint feedback that are compatible and complementary with existing systems and methods of pulse amplitude modulation.

In accordance with embodiments of the present invention, a driver electronic circuit for a pulse amplitude modulation transmitter includes a plurality of transmission lanes. Each transmission lane is configured to independently generate a current output corresponding to data input into each transmission lanes. The driver electronic circuit also includes a summing node configured to sum the output currents from the plurality of transmission lanes. The driver electronic circuit further includes one feedback loop circuit coupled to the plurality of transmission lanes configured to control the currents of each the current outputs. The driver electronic circuit may be configured to drive a vertical-cavity surface-emitting laser for optical communication.

BRIEF DESCRIPTION OF THE DRAWINGS

The accompanying drawings, which are incorporated in and form a part of this specification, illustrate embodiments of the invention and, together with the description, serve to explain the principles of the invention. Unless otherwise noted, the drawings may not be drawn to scale.

FIG. 3 illustrates an exemplary method of determining a resistance of a VCSEL, and setting bias and modulation currents based on the resistance, in accordance with embodiments of the present invention.

DETAILED DESCRIPTION

Figure 1:
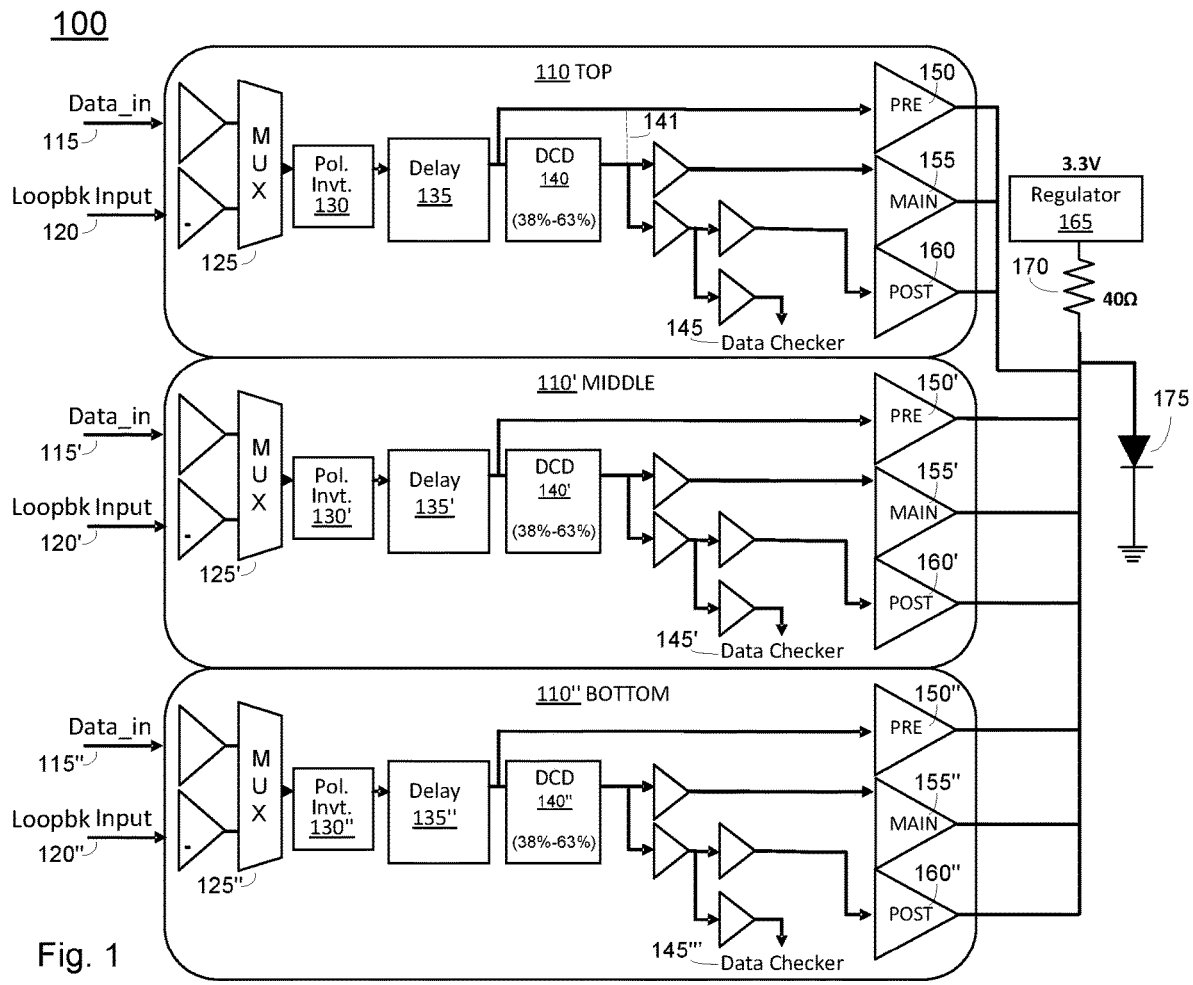
FIG. 1 illustrates a block diagram of an exemplary PAM-4 driver with distributed modulation current setpoint feedback, in accordance with embodiments of the present invention.

Reference will now be made in detail to various embodiments of the invention, examples of which are illustrated in the accompanying drawings. While the invention will be described in conjunction with these embodiments, it is understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the invention, numerous specific details are set forth in order to provide a thorough understanding of the invention. However, it will be recognized by one of ordinary skill in the art that the invention may be practiced without these specific details. In other instances, well known methods, procedures, components, and circuits have not been described in detail as not to unnecessarily obscure aspects of the invention.

Some portions of the detailed descriptions which follow (e.g., method 300) are presented in terms of procedures, steps, logic blocks, processing, and other symbolic representations of operations on data bits that may be performed on computer memory. These descriptions and representations are the means used by those skilled in the data processing arts to most effectively convey the substance of their work to others skilled in the art. A procedure, computer executed step, logic block, process, etc., is here, and generally, conceived to be a self-consistent sequence of steps or instructions leading to a desired result. The steps are those requiring physical manipulations of physical quantities. Usually, though not necessarily, these quantities take the form of electrical or magnetic signals capable of being stored, transferred, combined, compared, and otherwise manipulated in a computer system. It has proven convenient at times, principally for reasons of common usage, to refer to these signals as bits, values, elements, symbols, characters, terms, numbers, data, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "determining" or "measuring" or "driving" or "setting" or "accessing" or "capturing" or "storing" or "reading" or "analyzing" or "generating" or "resolving" or "accepting" or "selecting" or "displaying" or "presenting" or "computing" or "sending" or "receiving" or "reducing" or "detecting" or "setting" or "accessing" or "placing" or "testing" or "processing" or "performing" or "calculating" or "measuring" or "gathering" or "running" or the like, refer to the action and processes of, or under the control of, a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Exemplary embodiments of the following disclosures are presented in terms of a PAM-4 modulator that may be coupled to a vertical-cavity surface-emitting laser, known as or referred to as a VCSEL, configured to be coupled to an optical communications media, e.g., an optical fiber. It is appreciated, however, that embodiments in accordance with the present invention are well suited to other levels of pulse amplitude modulation, e.g., PAM-8, and other types of physical media, for example, light in free space, radio communications, including microwaves, sound, e.g., underwater communications, electrical signals, e.g., on wire(s), and the like.

Pam Driver With Distributed Modulation Current Setpoint Feedback

FIG. 1 illustrates a block diagram of an exemplary PAM-4 driver with distributed modulation current setpoint feedback 100, in accordance with embodiments of the present invention. Driver 100 and exemplary current feedback loop 200, further described below with respect to FIG. 2, may be implemented on a single integrated circuit device, in some embodiments. VCSEL 175 is typically external to such an integrated circuit device, although that is not required. Driver 100 comprises three "lanes" of modulators, a "top lane" modulator 110, a "middle lane" modulator 110', and a "bottom lane" modulator 110". The circuitry of each transmit lane is substantially the same. It is appreciated that certain settable parameters, e.g., delays, drive strength, and/or data input may vary from transmit lane to transmit lane. Currents, corresponding to input data, from all three transmit lanes are combined or summed in resistor 170 to drive VCSEL 175, which generates a light signal generally corresponding in magnitude to the current.

Driver 100 combines three streams of data, for example, non-return to zero (NRZ) data, into one linear PAM-4 stream, and in doing so provides an ability to control and program the bias current, modulation current as well as providing the controls necessary to accommodate the VCSEL characteristics in order to provide a clean optical eye.

Eye shaping may be facilitated by per-lane programmable controls for pre and post de-emphasis. The post de-emphasis includes a polarity switch to allow both under and over equalization. Over-equalization ability is sometimes necessary when driving a VCSEL, as the characteristics of the VCSEL are such that there is extreme peaking on the rising data edge. In accordance with embodiments of the present invention, in order to further help the post de-emphasis, on both rising and falling edges, a capacitor (not shown) may be placed on the emitter of the differential pair of the final output stage of each data stream, although that is not required. This helps to slow the rising edge of current into the VCSEL, while helping to speed up the falling edge, thereby countering some of the tendencies of the VCSEL in the electrical to optical conversion. Additional controls allow the skew between the three data streams to be programmed independently allowing further crucial eye shaping of the optical output.

Low drop out (LDO) Regulator 165 is set to provide an average bias current through resistor 170 to VCSEL 175. In addition, the LDO 165 supports the transient current required to generate the modulation current through VCSEL 175. Regulator 165 may comprise a plurality of registers to aid in setting a bias current and/or modulation current, in some embodiments.

Top lane 110 accesses a data stream input 115. Data stream input 115 comprises binary, high/low data. Data stream input 115 may be characterized as a pseudo-random bit stream (PRBS), in some embodiments. Loopback input 120 may be used in a test mode to run known data through top lane 110, via data checker 145, to test data integrity, in some embodiments. In a working, not-test, environment, data stream input 115 flows through multiplexor 125 to polarity inverter 130. Polarity inverter 130 enables the data stream input 115 to be selectively inverted, if desired. Delay block 135 enables the data stream to be delayed, for example, by zero to about 0.25 UI. In some embodiments, the delay may be greater than 0.25 UI. Such a delay may be utilized to account for differing rise and fall times in a modulator, e.g., a VCSEL, according to current magnitudes, in embodiments. For example, a VCSEL may have a different rise time for a "1" bit in a top channel in comparison to a "1" bit in a bottom channel.

The output of delay 135 is sent to "pre" current source 150. Pre current source 150 provides an early current corresponding to the data stream input 115. The output of delay 135 is also sent to duty cycle distortion correction block 140. Duty cycle distortion correction block 140 functions to selectively correct for offsets or distortions in bit shapes in a data stream, e.g., due to process variations. In some embodiments, the input to pre current source 150 may be coupled to the output of duty cycle distortion correction block 140 rather than the output of delay block 135, for example, bypassing duty cycle distortion correction block 140 as indicated by the dashed line 141. Such a modification would typically apply to lanes 110' and 110" as well. The output of duty cycle distortion correction block 140 moves through a delay stage to main current source 155. Main current source 155 provides an on-time current corresponding to the data stream input 115. The output of duty cycle distortion correction block 140 moves through multiple delay stages to post current source 160. Post current source 160 provides a late current corresponding to the data stream input 115. The combination or sum of pre current source 150, main current source 155, and post current source 160 are combined to from a desired optical wave shape for the top lane (or top "eye") at the output of VCSEL 175. Similarly, "middle lane" modulator 110' may shape a middle eye optical pattern, and "bottom lane" modulator 110" may shape a bottom eye optical pattern. In some embodiments, all such current sources may be programmable.

Figure 2:
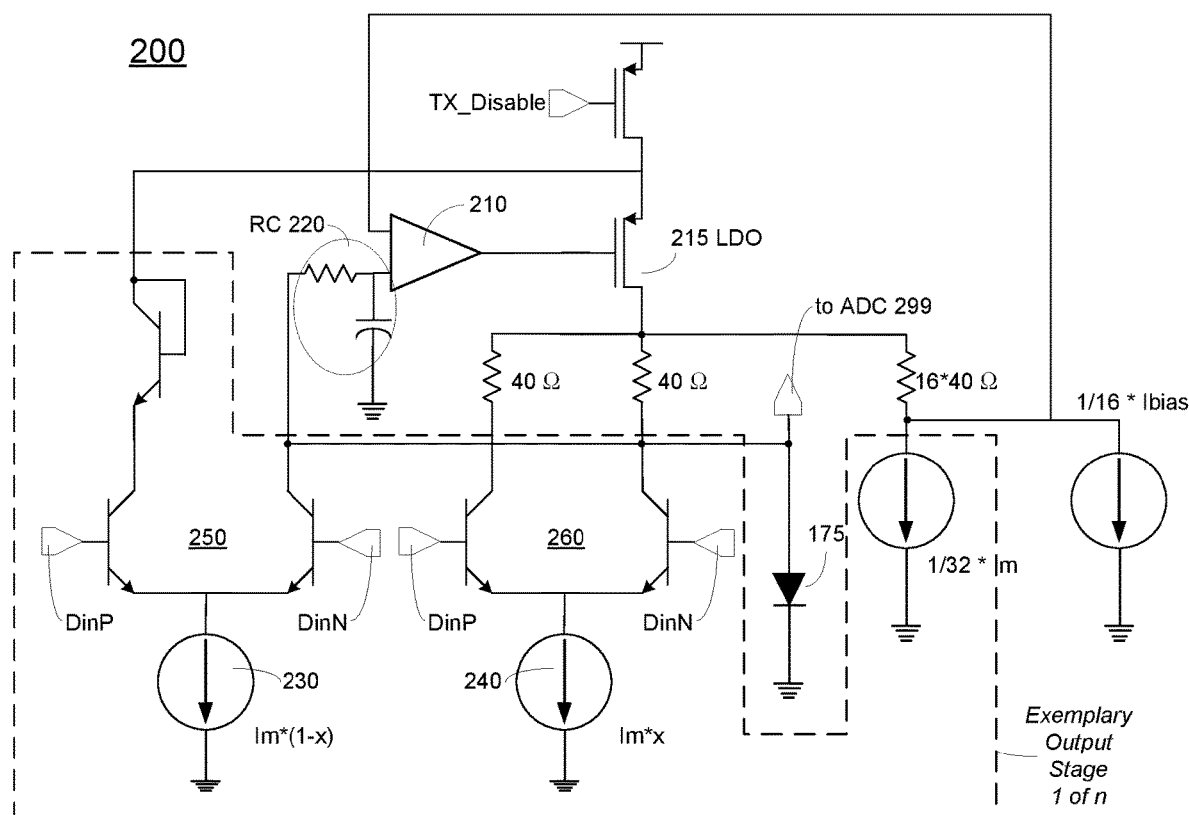
FIG. 2 illustrates a schematic diagram of an exemplary current feedback loop 200, in accordance with embodiments of the present invention.

FIG. 2 illustrates a schematic diagram of an exemplary current feedback loop 200, in accordance with embodiments of the present invention. The circuits within the dashed boundary illustrate output driver circuitry for one output driver for one transmit lane, for example, main current source 155 as described with respect to FIG. 1. The circuitry outside of the dashed boundary represents the single current feedback loop. In an embodiment consistent with driver 100 of FIG. 1, there would be nine total output drivers, e.g., "pre" current source 150, main current source 155, and post current source 160 for top lane 110, "pre" current source 150', main current source 155', and post current source 160' for middle lane 110', and "pre" current source 150", main current source 155", and post current source 160" for top lane 110". All nine drivers are coupled to the single current feedback loop in the manner illustrated for the exemplary main current source 155.

Bias and modulation current levels are controlled by a feedback loop 200 comprising a low drop out (LDO) regulator 215 and an operational amplifier 210. Each output stage, for example nine in total, including the pre and post de-emphasis output stages, contribute a current proportional to the total desired modulation current in order to define the setpoint for the op-amp 210 controlling the LDO 215. For example, the current is 1/32 of the tail current for that particular stage. Thus, the modulation current setpoint is defined by a distributed architecture. Additional current for the bias is also summed in order to properly drive the LDO 215 output voltage such that the desired power level is achieved in the VCSEL 175. Due to the linear nature of the summing of output main, pre and post de-emphasis paths, currents are summed into a termination load, for example, 40 ohms. The resistance value of this termination load should be selected to allow for sufficient headroom for a low dropout regulator, e.g., LDO 215, and may vary in accordance with embodiments of the present invention. In this manner, the range of modulation current settings, and a desirably high extinction ratio (ER), e.g., >6 dB, in the output optical signal may be achieved.

In FIG. 2, Ibias is an average biasing current in VCSEL 175, for example about 6 mA. An exemplary zero level in VCSEL 175, e.g., representing data of 00 binary is 2 mA. An exemplary high level in VCSEL 175, e.g., representing data of 11 binary is 10 mA. Thus, four current levels correspond to the four combinations of two bits. For example, 2 mA corresponds to a minimum output power of a VCSEL in operation, e.g., a data value of 00 binary.

Im is a "tail current" through the differential driver pairs 250 and 260, generated by current sources 230 and 240. A percentage "x" of the total Im is generated by current source 240, and the remainder of total Im is generated by current source 230. Undesirable voltage ripple on the LDO 165 output is minimized by Relation 1, below, based on the resistance of VCSEL 175, referred to as "Rvcsel."

$$x = Rvcsel/(Rvcsel+40) \quad \text{(Relation 1)}$$

The tail current Im, the total current for all exemplary nine stages combined, is based on the resistance of VCSEL, referred to as "Rvcsel," and the modulation current, Imod, which is equal to 8 mA (high level current minus low level current), according to Relation 2, below:

$$Im = Imod*(Rvcsel+40)/40 \quad \text{(Relation 2)}$$

Note that the total Im will include contributions from up to the exemplary nine stages, and will not necessarily be equally distributed among the multiple stages. For example, a current contribution for any given stage may vary according to data and eye shaping requirements. The embodiment of FIG. 2 is shown as having differential data drivers. "DinP" stands for Data In Positive, while "DinN" stands for Data In Negative.

Some current in every switching cycle bypasses LDO 215. If the total current passed through LDO 215, such total current would produce an undesirable ripple. Operational amplifier 210 controls the gate of LDO 215 to generate the correct bias and modulation currents. The output current to VCSEL 175 goes through an RC low pass filter 220 as one input to op amp 210. The other input to op amp 210 is a current that is a ratio of the tail currents, which is a function of the bias current desired for the VCSEL plus the tail modulation. In some embodiments, some or all such current sources may be programmable.

As previously presented, it is necessary to know the resistance of VCSEL 175 in order to set bias and modulation currents so as to minimize ripple. See, for example, Relation 1, above. Unfortunately, the resistance of different VCSELs varies, and is frequently not well documented by the VCSEL manufacturer. In addition, a VCSEL is often selected and/or provided by a party other than the manufacturer of an integrated circuit device comprising circuits 100 (FIG. 1) and/or circuits 200 (FIG. 2), and often selected after manufacture of such an integrated circuit.

In accordance with embodiments of the present invention, the resistance of a VCSEL, e.g., VCSEL 175 (FIG. 2), may be determined in situ, for use in setting the tail currents of the differential driver pairs 250, 260.

In accordance with embodiments of the invention, the anode of VCSEL 175 is coupled to analog to digital converter 299 (not shown). Two different currents are coupled through VCSEL 175. For example, a first calibration current of, for example, 4 mA, is coupled through VCSEL 175, and a first voltage measurement across VCSEL 175 is made via analog to digital converter 299. A second calibration current of, for example, 6 mA, is coupled through VCSEL 175, and a second voltage measurement across VCSEL 175 is made via analog to digital converter 299. From the two voltage measurements with known currents, a resistance of VCSEL 175 may be determined. In this novel manner, a resistance of a VCSEL does not need to be known by the party selecting and/or operating a VCSEL for use in a transmitter system.

FIG. 3 illustrates an exemplary method 300 of determining a resistance of a VCSEL, and setting bias and modulation currents based on the resistance, in accordance with embodiments of the present invention. Method 300 may be implemented by a stored program computer in some embodiments. In some embodiments, method 300 may be implemented by a finite state machine. Such a stored program computer and/or such a finite state machine may be included on an integrated circuit device comprising circuits 100 and/or 200, in some embodiments. In some embodiments, the stored program computer and/or the finite state machine may be external to such an integrated circuit device.

In 310, a first voltage across a VCSEL, e.g., VCSEL 175 of FIG. 2, is measured, e.g., by analog to digital converter 299, based on a first calibration current coupled through the VCSEL. In an exemplary embodiment, the first calibration current is about 4 mA. In 320, a second voltage across a VCSEL, e.g., VCSEL 175 of FIG. 2, is measured, e.g., by analog to digital converter 299, based on a second calibration current coupled through the VCSEL. In an exemplary embodiment, the second calibration current is about 6 mA. In 630, a resistance value of the VCSEL is determined based on the voltage measurements and the known currents.

In 340, a bias current, e.g., Ibias (FIG. 2), and modulation currents, e.g., Imod (FIG. 2), of a PAM driver, e.g., PAM driver 100 (FIG. 1) are set based on Relations 1 and 2. In optional 350, a PAM driver, e.g., PAM driver 100 (FIG. 1), drives communication data into the VCSEL using the bias current and modulation currents as established, and utilizing a feedback circuit, e.g., feedback circuit 200 (FIG. 2), to maintain such currents.

Embodiments in accordance with the present invention provide systems and methods for pulse amplitude modulation (PAM) drivers with distributed modulation current setpoint feedback. In addition, embodiments in accordance with the present invention provide systems and methods for PAM drivers with distributed modulation current setpoint feedback in which a single linear feedback control circuit controls bias and modulation currents of multiple transmission lanes. Further, embodiments in accordance with the present invention provide systems and methods for PAM drivers with distributed modulation current setpoint feedback that are compatible and complementary with existing systems and methods of pulse amplitude modulation.

Although the invention has been shown and described with respect to a certain exemplary embodiment or embodiments, equivalent alterations and modifications will occur to others skilled in the art upon the reading and understanding of this specification and the annexed drawings. In particular regard to the various functions performed by the above described components (assemblies, devices, etc.) the terms (including a reference to a "means") used to describe such components are intended to correspond, unless otherwise indicated, to any component which performs the specified function of the described component (e.g., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more features of the other embodiments as may be desired and advantageous for any given or particular application.

Various embodiments of the invention are thus described. While the present invention has been described in particular embodiments, it should be appreciated that the invention should not be construed as limited by such embodiments, but rather construed according to the below claims.

We claim:

1. A driver electronic circuit for a pulse amplitude modulation optical transmitter, said driver electronic circuit comprising:
   a plurality of transmission lanes, wherein each transmission lane is configured to independently generate a current output corresponding to data input into each transmission lanes,
   wherein each transmission lane further comprises a delay element operable to account for differing rise and fall time characteristics of said modulation optical transmitter;
   a summing node configured to sum the output currents from the plurality of transmission lanes; and
   one feedback loop circuit coupled to the plurality of transmission lanes configured to control the currents of each said current outputs.

2. The driver electronic circuit of claim 1 wherein each of said plurality of transmission lanes comprises three current sources corresponding to early, on-time, and late data.

3. The driver electronic circuit of claim 2 wherein said one feedback loop is coupled to said three current sources of each of said plurality of transmission lanes.

4. The driver electronic circuit of claim 1 configured to drive a vertical-cavity surface-emitting laser (VCSEL).

5. The driver electronic circuit of claim 4 wherein said one feedback loop circuit comprises an operational amplifier configured to control a low dropout regulator, the operational amplifier comprising an input configured to sense a low pass filtered version of current to said VCSEL.

6. The driver electronic circuit of claim 5 wherein said one feedback loop circuit is configured such that a portion of current bypasses said low dropout regulator in every switching cycle.

7. The driver electronic circuit of claim 4 further configured to measure a resistance of said VCSEL, and utilize said resistance in said one feedback loop circuit to control bias and modulation currents of each said current output.

8. A feedback loop circuit configured to control bias and modulation currents for more than one transmission lane of pulse amplitude modulation drivers, wherein each of said more than one transmission lanes comprises a delay element operable to account for differing rise and fall time characteristics of an optical modulator.

9. The feedback loop circuit of claim 8 wherein said modulation current is set as a function of a resistance of a vertical-cavity surface-emitting laser (VCSEL).

10. The feedback loop circuit of claim 9 further configured to measure said resistance of said VCSEL.

11. The feedback loop circuit of claim 9 further comprising an operational amplifier configured to control a low dropout regulator, the operational amplifier comprising an input configured to sense a low pass filtered version of current to said VCSEL.

12. The feedback loop circuit of claim 8 configured to control said bias and modulation currents for at least three transmission lanes of pulse amplitude modulation drivers.

13. The feedback loop circuit of claim 12 wherein each of said at least three transmission lanes comprises three current sources corresponding to early, on-time, and late data.

14. The feedback loop circuit of claim 12 wherein each of said at least three transmission lanes comprises a duty cycle distortion correction circuit configured to selectively correct for distortions in bit shapes of a data stream within a corresponding transmission lane.

15. A method of providing feedback control to a plurality of pulse amplitude modulation transmission lanes, where said plurality of transmission lanes are configured to drive a common vertical-cavity surface-emitting laser (VCSEL), and wherein each of said plurality of transmission lanes comprises a delay element operable to account for differing rise and fall time characteristics of said VCSEL,
   the method comprising:
   accessing a measurement of a resistance of said VCSEL;
   setting bias and modulation currents of current drivers of said plurality of transmission lanes based on said resistance; and
   controlling said bias and modulation currents of said plurality of transmission lanes via one feedback control circuit coupled to said plurality of transmission lanes.

16. The method of claim 15 wherein said one feedback control circuit comprises an operational amplifier configured to control a low dropout regulator, the operational amplifier comprising an input configured to sense a low pass filtered version of current to said VCSEL.

17. The method of claim 15 further comprising bypassing a current portion around a low dropout regulator in every switching cycle.

18. The method of claim 15 wherein each of said plurality of transmission lanes comprises three current sources corresponding to early, on-time, and late data.

19. The method of claim 18 wherein said one feedback control circuit is coupled to and controls said three current sources for each of three transmission lanes.

20. The method of claim 15 further comprising measuring said resistance of said VCSEL.

* * * * *